US00RE41813E

(19) United States
(12) Reissued Patent
Nishihara et al.

(10) Patent Number: US RE41,813 E
(45) Date of Reissued Patent: Oct. 12, 2010

(54) PIEZOELECTRIC THIN-FILM RESONATOR AND FILTER USING THE SAME

(75) Inventors: Tokihiro Nishihara, Kanagawa (JP); Tsuyoshi Yokoyama, Kanagawa (JP); Takeshi Sakashita, Kanagawa (JP); Masafumi Iwaki, Kanagawa (JP); Tsutomu Miyashita, Kanagawa (JP)

(73) Assignees: Taiyo Yuden Co., Ltd., Tokyo (JP); Fujitsu Media Devices Limited, Yokohama (JP)

(21) Appl. No.: 12/276,318

(22) Filed: Nov. 22, 2008

Related U.S. Patent Documents

Reissue of:
(64) Patent No.: 7,211,931
Issued: May 1, 2007
Appl. No.: 10/966,035
Filed: Oct. 18, 2004

(51) Int. Cl.
*H01L 41/08* (2006.01)

(52) U.S. Cl. ..... 310/324; 310/366
(58) Field of Classification Search ..... 310/320, 310/366, 365, 324, 311, 363; 333/187, 189; *H01L 41/047, 41/08*
See application file for complete search history.

(56) References Cited

U.S. PATENT DOCUMENTS

| | | | | | |
|---|---|---|---|---|---|
| 4,642,508 | A | * | 2/1987 | Suzuki et al. | 310/324 |
| 5,281,935 | A | * | 1/1994 | Knecht et al. | 333/187 |
| 6,147,438 | A | * | 11/2000 | Nishiwaki et al. | 310/363 |
| 6,150,703 | A | | 11/2000 | Cushman et al. | |
| 6,215,375 | B1 | | 4/2001 | Larson et al. | 310/365 |
| 6,384,697 | B1 | | 5/2002 | Ruby | |
| 7,199,504 | B2 | * | 4/2007 | Komuro et al. | 310/366 |
| 7,498,717 | B2 | * | 3/2009 | Yokoyama et al. | 310/320 |
| 2003/0127945 | A1 | | 7/2003 | Nakamura et al. | |

FOREIGN PATENT DOCUMENTS

| | | | |
|---|---|---|---|
| JP | 6-295181 | A | 10/1994 |
| JP | 8-148968 | A | 6/1996 |
| JP | 2003-133892 | | 5/2003 |
| JP | 2003-204239 | | 7/2003 |
| JP | 2003-289235 | A | 10/2003 |
| JP | 2004-200843 | A | 7/2004 |
| JP | 2005-33379 | A | 2/2005 |
| JP | 2005-109678 | A | 4/2005 |
| JP | 2005-236518 | A | 9/2005 |
| JP | 2006-157259 | A | 6/2006 |
| WO | WO 03/041273 | A1 | 5/2003 |

* cited by examiner

*Primary Examiner*—Walter Benson
*Assistant Examiner*—Karen B Addison
(74) *Attorney, Agent, or Firm*—Arent Fox LLP

(57) ABSTRACT

A piezoelectric thin-film resonator includes a substrate, a lower electrode arranged on the substrate, a piezoelectric film arranged on the lower electrode, and an upper electrode arranged on the piezoelectric film. A region in which the upper electrode overlaps with the lower electrode through the piezoelectric film has an elliptical shape, and a condition such that $1<a/b<1.9$ is satisfied where a is a main axis of the elliptical shape, and b is a sub axis thereof.

14 Claims, 9 Drawing Sheets a/b = 1.2 a/b = 4.0

SUB AXIS IS PARALLEL
TO CURRENT DIRECTION

MAIN AXIS IS PARALLEL
TO CURRENT DIRECTION

AXIS IS SLANTED
BY 45 DEGREES

PIEZOELECTRIC THIN-FILM RESONATOR AND FILTER USING THE SAME

Matter enclosed in heavy brackets [ ] appears in the original patent but forms no part of this reissue specification; matter printed in italics indicates the additions made by reissue.

BACKGROUND OF THE INVENTION

1. Field of the Invention

This invention generally relates to piezoelectric thin-film resonator and a filter using the same.

2. Description of the Related Art

Wireless devices as represented by mobile telephones have spread rapidly, and there has been an increasing demand for a downsized and lightweight resonator and a filter equipped with the same. A dielectric substance and a surface acoustic wave have been used extensively so far; however, the piezoelectric thin-film resonator and the filter equipped with the same have excellent high frequency characteristics, can be downsized, and can be incorporated into a monolithic circuit. Therefore, the piezoelectric thin-film resonator and the filter using the same are attracting attention.

The piezoelectric thin-film resonator may be categorized into FBAR (Film Bulk Acoustic Resonator) type and SMR (Solidly Mounted Resonator) type. The FBAR type includes main components on a substrate from the top, namely, an upper electrode, a piezoelectric film, and a lower electrode. There is a cavity below the lower electrode that is overlapped with the upper electrode through the piezoelectric film. The cavity is defined by wet etching a sacrifice layer on the surface of the silicon substrate, wet or dry etching from the backside of the silicon substrate, or the like. In the present description, a membrane is defined as a film-laminated structure that is located above the cavity and a main component composed of the lower electrode, piezoelectric film and the upper electrode. The SMR type employs an acoustic reflector instead of the cavity, the acoustic reflector being composed of films having high and low acoustic impedances alternately laminated with a film thickness of $\lambda/4$ where $\lambda$ is a wavelength of an elastic wave. When a high-frequency electric signal is applied across the upper electrode and the lower electrode, an elastic wave is excited inside the piezoelectric film sandwiched between the upper electrode and the lower electrode, due to the inverse piezoelectric effect. Meanwhile, a distortion generated by the elastic wave is converted into an electric signal due to piezoelectric effect. The elastic wave is totally reflected by the surfaces of the upper and lower electrodes that respectively interface with air, and it is thus converted into a thickness-extensional wave having a main displacement in the thickness direction. In the above-mentioned structure, a resonance occurs at frequencies at which the total thickness H of the membrane is equal to integer multiples (n times) of half the wavelength of the elastic wave. When the propagation velocity, which depends on materials, is denoted as V, the resonance frequency F is described as $F=nV/2H$. The resonator and the filter having desired frequency characteristics can be produced by utilizing the resonance and controlling the resonance frequency with the film thickness.

Materials for the electrodes may, for example, be aluminum (Al), copper (Cu), molybdic (Mo), tungsten (W), tantalum (Ta), platinum (Pt), rhodium (Ru), or iridium (Ir). Materials for piezoelectric films may, for example, be aluminum nitride (AlN), zinc oxide (ZnO), lead zirconate titanate (PZT), or lead titanate ($PbTiO_3$). The substrate may be made of silicon, glass, or the like.

However, in addition to the thickness-extensional wave, the above-mentioned piezoelectric thin-film resonator has undesired waves of the lateral mode that are propagated in parallel with the electrode surface, and are reflected by the interfaces or an edge of the cavity. This adversely generates an unnecessary spurious component in the impedance characteristics of the resonator, or a ripple in the passband of the filter. This causes a problem in an application. In order to suppress such adverse affects caused by the lateral mode wave, U.S. Pat. No. 6,150,703 (hereinafter referred to as Document 1) and U.S. Pat. No. 6,215,375 (hereinafter referred to as Document 2) disclose piezoelectric thin-film resonators having electrodes including non-square and irregular polygons in which any two sides are not parallel. In the proposed piezoelectric thin-film resonators, the lateral mode waves reflected by any points are reflected and travel in different directions from the previous directions. Thus, the lateral mode waves do not resonate, so that the above-mentioned problem can be solved effectively. In addition, in order to solve a similar problem, Japanese Patent Application Publication No. 2003-133892 (hereinafter referred to as Document 3) discloses a piezoelectric thin-film resonator having an upper electrode of elliptical shape. The upper electrode satisfies $1.9<a/b<5.0$, where a is the main axis of the elliptical shape, and b is the sub axis thereof.

The structures and configurations of Documents 1, 2 and 3 are certainly effective in solving the above-mentioned problems. However, the proposed structures and configurations degrade the strength of the membrane or the productivity of the cavity to the contrary. This will be described below. The thickness of the membrane, which depends on the sound speed of the material, is as very thin as approximately 0.5 to 3 μm in a wireless system having a frequency range of 900 MHz to 5 GHz. An unexpected external force easily damages the membrane, and it is thus important to consider the technique to improve the strength.

One solution is to reduce the damage of the membrane caused by internal stress by reducing the internal stress of each film at the time of forming the film. However, the inventors' study shows that piezoelectricity is improved when compression stress is exerted on the piezoelectric film, and a resonance characteristic having a large electromechanical coupling coefficient ($K^2$) is obtainable. From this viewpoint, the membrane having compression stress is very effective if a technique to achieve a desired strength of the membrane is available. One of the effective methods is to design the membrane so that stress is evenly applied to the membrane or the membrane is not damaged easily by the same internal stress. Unfortunately, any one of Documents 1, 2, and 3 has a structurally unbalanced symmetry, and the force applied to the membrane is not equal. Thus, the membrane is easily distorted and damaged. This results in a serious problem that resonance characteristics and filter characteristics show large irregularity.

Preferably, the cavity has the same shape as that of the region in which the upper electrode overlaps with the lower electrode, and has a similar size to that of the region. If the size of the cavity is much bigger than that of the overlapping region, the membrane will be easily damaged. Thus, it is not recommended. In addition, the productivity of the cavities disclosed in Documents 1 through 3 is not good. The cavities described in Documents 1 and 2 have corners. The cavity described in Document 3 has an elliptical shape with a ratio a/b as large as $1.9<a/b<5.0$ where the length of the main axis is denoted as a and that of the sub axis is denoted as b. That is, the desired shape of the cavity is not obtainable because the etching velocity is low at the corners of the cavity. The lower electrode disclosed in Document 3 has a considerably large size, as compared to that of the upper electrode. This results in stray capacitance between the overlapping extensions of the upper electrode and the lower electrode, and degrades the electromechanical coupling coefficient ($K^2$).

SUMMARY OF THE INVENTION

The present invention has been made in view of the above circumstances and provides a piezoelectric thin-film resonator and a filter using the same.

More specifically, the present invention provides a piezoelectric thin-film resonator and a filter equipped with the same that show little irregularity in characteristics, by employing a structure that makes it possible to suppress the adverse affects caused by the lateral mode waves and to achieve a sufficient strength of the membrane and excellent productivity of the cavity.

Another object of the present invention is to provide a piezoelectric thin-film resonator and a filter equipped with the same having a large electromechanical coupling coefficient ($K^2$) by the use of a film having a desired compression stress.

According to an aspect of the present invention, there is provided a piezoelectric thin-film resonator including a substrate, a lower electrode arranged on the substrate, a piezoelectric film arranged on the lower electrode, and an upper electrode arranged on the piezoelectric film, in which a region in which the upper electrode overlaps with the lower electrode through the piezoelectric film has an elliptical shape, and $1<a/b<1.9$ is satisfied, where a is a main axis of the elliptical shape, and b is a sub axis thereof.

A cavity may be formed in the substrate and located below the region having the elliptical shape.

According to another aspect of the present invention, there is provided a piezoelectric thin-film resonator comprising a substrate, a lower electrode arranged on the substrate, a piezoelectric film arranged on the lower electrode, and an upper electrode arranged on the piezoelectric film. A cavity is provided in the substrate and is located under the lower electrode in a region in which the upper electrode overlaps with the lower electrode through the piezoelectric film. A membrane that includes the upper electrode and the lower electrode is formed above the cavity and is curved outwards. The membrane has a maximum height that is measured from a surface of the substrate and is at least 1.5 times the thickness of the membrane.

According to a further aspect of the present invention, there is provided a filter with any of the above-mentioned piezoelectric thin-film resonators.

BRIEF DESCRIPTION OF THE DRAWINGS

Preferred embodiments of the present invention will be described in detail with reference to the following figures, wherein.

DESCRIPTION OF THE PREFERRED EMBODIMENTS

A description will now be given, with reference to the accompanying drawings, of embodiments of the present invention.

First Embodiment

Figure 1A:
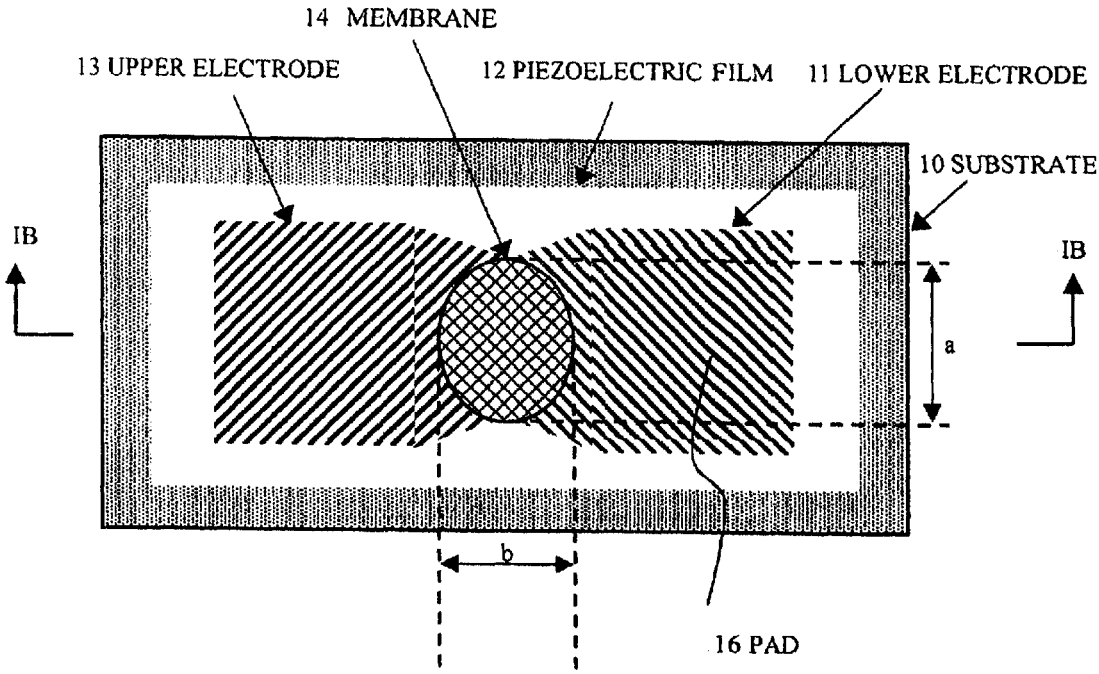
FIG. 1A shows a plane view of a piezoelectric thin-film resonator in accordance with the present invention.
Figure 1B:
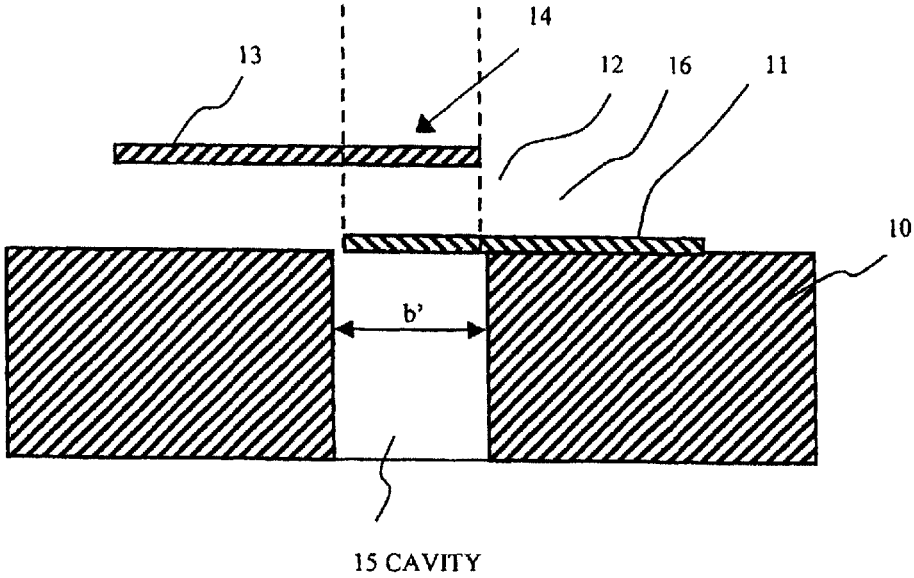
FIG. 1B shows a cross-section view taken along a line $I_B$—$I_B$ shown in FIG. 1A.

FIG. 1A shows a plain view of a piezoelectric thin-film resonator in accordance with a first embodiment of the present invention. FIG. 1B shows a cross-section view taken along a line $I_B$—$I_B$ shown in FIG. 1A. The piezoelectric thin-film resonator shown in FIGS. 1A and 1B includes a substrate 10, a lower electrode 11 arranged on the substrate 10, a piezoelectric film 12 arranged on the lower electrode 11, and an upper electrode 13 arranged on the piezoelectric film 12. The electrode 10 is made of, for example, silicon (Si). The lower electrode 11 is made of a conductive material having a double layer structure of, for example, ruthenium (Ru) and chromium (Cr). The layer of ruthenium is arranged on a main surface of the substrate 10. The piezoelectric film 12 is made of a piezoelectric material, for example, aluminum nitride (AlN). The upper electrode 13 is made of a conductive material having a single layer structure of ruthenium (Ru), for example. For example, the piezoelectric thin-film resonator that has a resonance frequency of 5.2 GHz may be configured so that the lower electrode 11 is a Ru (100 nm)/Cu (50 nm) film, and the piezoelectric film of AlN is 400 nm thick, the upper electrode 13 of Ru being 100 nm thick. The piezoelectric film 12 has an opening, via which the lower electrode 11 is partially exposed. The exposed portion of the lower electrode 11 is used as a pad 16. Referring to FIG. 1B, a cavity 15 is formed in the substrate 10 below a region (resonator) where the upper electrode 13 and the lower electrode 11 overlap through the piezoelectric film 12. In accordance with the first embodiment of the present invention, the cavity 15 has substantially perpendicular side walls, which may be formed by dry-etching the silicon substrate 10 from the backside thereof with fluorine gas. The cross section of the cavity 15 has an elliptical shape in a direction parallel to the main surface of the substrate 10, on which the lower electrode 11 and the like are disposed.

The technical merits of the present invention may be obtained by materials other than the above-mentioned materials of the substrate 10, the upper and lower electrodes 11 and 13, and the piezoelectric film 12. For example, the materials disclosed in Documents 1, 2, and 3 may be used. In addition, the cavity 15 as shown in FIG. 1B penetrates the substrate 10; however, the cavity 15 may be formed only on the surface of the substrate 10, and may be formed with the use of a sacrifice layer. Further, it is to be noted that the above-mentioned membrane is composed of only main component elements of the piezoelectric thin-film resonator. In practice, the membrane may have an additional layer or film. For instance, a dielectric layer may be added below the lower electrode 11 to reinforce it. Such a dielectric layer may serve as an etching stopper. Another dielectric layer may be provided on the surface as a passivation film. Bumps or a conductive layer for wire bonding may be provided so as to underlie the pads of the electrodes.

As shown in FIG. 1A, a region 14 where the upper electrode 13 overlaps with the lower electrode 11 has an elliptical shape. The region 14 forms a membrane 14 (resonator). In accordance with the first embodiment, the elliptical shape of the membrane 14 satisfies $1<a/b<1.9$, where a is the main axis of the elliptical-shaped membrane 14 and b is the sub axis thereof. The above condition is based on the following study by the inventors.

Figure 2A:
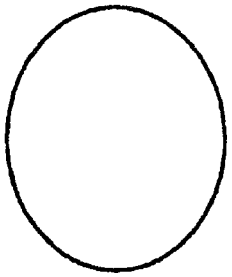
FIGS. 2A and 2B show elliptical shapes having a different ratio of an axis a to an axis b.
Figure 2B:
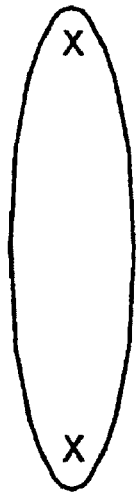

The inventors found out a problem caused during the process of forming the cavity 15 when the length ratio of a/b is large and the elliptical shape is greatly curved. FIGS. 2A and 2B show exemplary elliptical shapes of the region 14 where the upper electrode 13 overlaps with the lower electrode 11. FIG. 2A shows an elliptical shape where a/b=1.2 in which a=75.9 μm, and b=63.3 μm. FIG. 2B shows an elliptical shape where a/b=4.0 in which a=138.7 μm and b=34.7 μm. For the greatly curved elliptical shape of a/b=4.0, the etching rate considerably decreases in tapered-off portions indicated by X at the time of dry-etching silicon. Thus, etching residue is at the tapered-off portions, so that the desired shape of the cavity cannot be obtained. Alternatively, if silicon is over-etched to avoid etching residue, a larger amount of residual will adhere to an area where etching has already been made or a sidewall of the cavity. This residue will lead to degradation and irregularity of characteristics. Such affects will occur to the vicinity of the apexes of a polygon that does not have a shape of square as disclosed in Documents 1 and 2. This problem can be solved by forming the elliptical shape having the ratio a/b as small as possible. The above-mentioned problems can be substantially ignored by forming the cavity 15 so that $1<a/b<1.9$ is satisfied.

In the above-mentioned range of $1<a/b<1.9$, it is essential that a ripple caused by a lateral mode is suppressed to the level that does not pose a problem. Then, four different filters equipped with piezoelectric thin-film resonators are made to evaluate the ripple in a passband. The four filters have the ratios of 1.0 (a circle), 1.2, 1.9, and 4.0 in the region in which the upper electrode 13 overlaps the lower electrode 11 through the piezoelectric film 12. Table 1 shows sizes of the elliptical shape in series-arm and parallel-arm resonators.

TABLE 1

| | Series-arm resonator | | Parallel-arm resonator | |
|---|---|---|---|---|
| a/b | a | b | a | b |
| 1.0 | 69.4 | 69.4 | 49.1 | 49.1 |
| 1.2 | 75.9 | 63.3 | 53.7 | 44.8 |

TABLE 1-continued

| | Series-arm resonator | | Parallel-arm resonator | |
|---|---|---|---|---|
| a/b | a | b | a | b |
| 1.9 | 95.6 | 50.3 | 67.6 | 35.6 |
| 4.0 | 138.7 | 34.7 | 98.1 | 24.5 |

Unit: μm

Figure 3A:
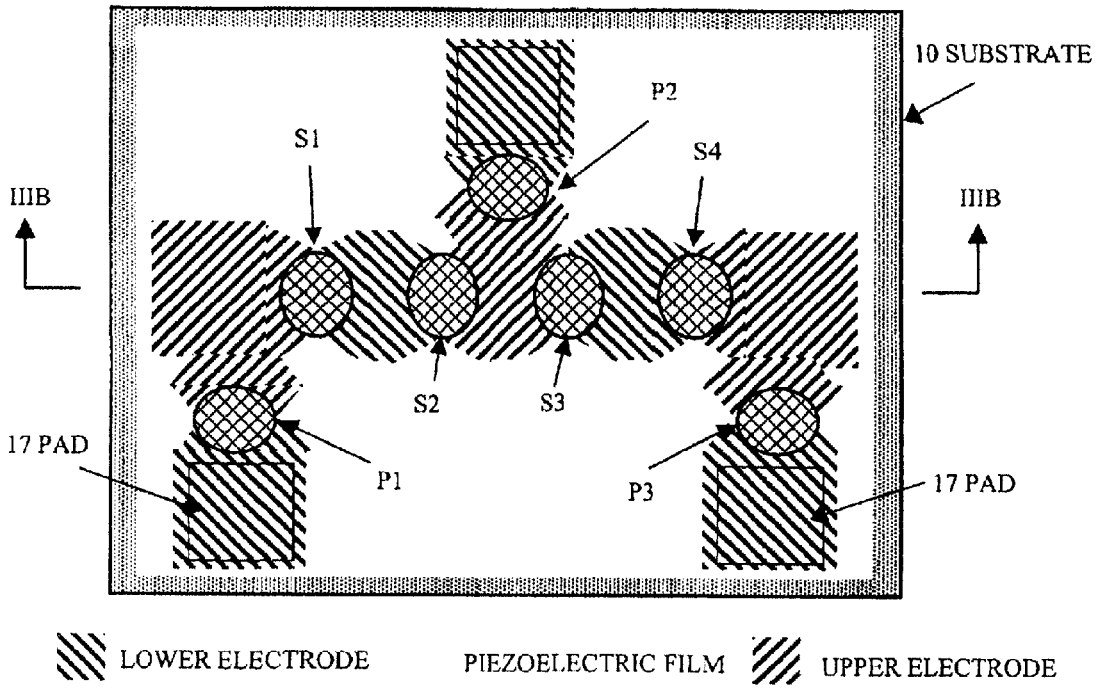
FIG. 3A shows a plane view of a filter.
Figure 3B:
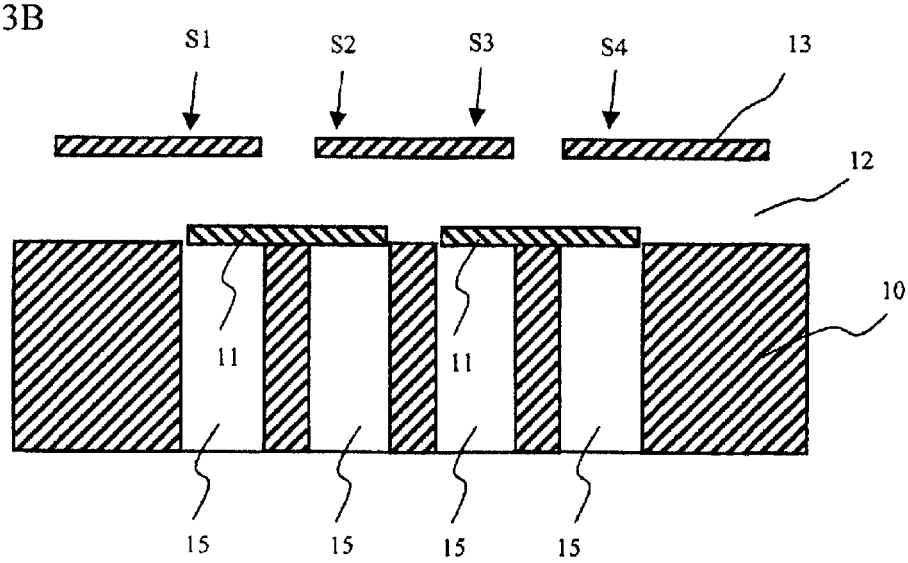
FIG. 3B shows a cross-section view taken along a line $III_B$—$III_B$ shown in FIG. 3A.
Figure 4:
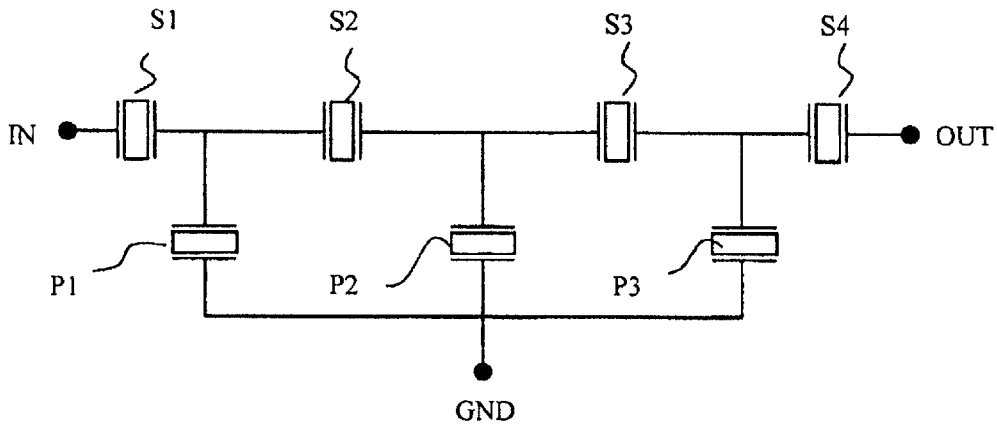
FIG. 4 shows a circuit diagram of the filter shown in FIGS. 3A and 3B.

FIGS. 3A, 3B, and 4 show the structure of the above-mentioned four filters. More particularly, FIG. 3A is a plane view of the filter, and FIG. 3B is a cross-section view taken along a line $III_B$—$III_B$ shown in FIG. 3A. FIG. 4 is a circuit diagram of the filter shown in FIGS. 3A and 3B. In FIGS. 3A and 3B, the same components and configurations as those of FIGS. 1A and 1B have the same reference numerals. There is illustrated a ladder-type filter that includes series-arm resonators S1, S2, S3, and S4 and parallel-arm resonators P1, P2, and P3 on the substrate 10. In the filter, four piezoelectric thin-film resonators S1, S2, S3, and S4 are respectively disposed in series arms, and three piezoelectric thin-film resonators P1, P2, and P3 are respectively disposed in parallel arms. The fundamental structure of the filter is the same as that of the aforementioned piezoelectric thin-film resonator. In practice, an insulating film such as an $SiO_2$ film (approximately 90 nm) may be provided on the upper electrodes of the parallel resonators P1, P2, and P3 in order to decrease the resonance frequencies of the parallel-arm resonators and to thus obtain the desirable bandpass filter characteristics. All the resonators S1 through S4 and P1 through P3 have the same configurations as those shown in FIGS. 1A and 1B. The substrate 10 is provided commonly to all the resonators S1 through S4 and P1 through P3. Similarly, the piezoelectric film 12 is also commonly provided to all the resonators S1 through S4 and P1 through P3. Some of the lower electrode 11 and the upper electrode 13 are shared by adjacent resonators. For example, the series-arm resonators S1 and S2 share the same upper electrode 13. In each of the resonators S1 through S4 and P1 through P3, the cavity 15 is provided in the substrate 10 below the region where the upper electrode 13 overlaps with the lower electrode 11 through the dielectric film 12. The series-arm resonators in the Table 1 are the series-arm resonator S1 through S4, and the parallel-arm resonators are P1 through P3. The lower electrode 11 is partially exposed through the cavities 15, and the exposed portions serve as pads 17.

Figure 5:
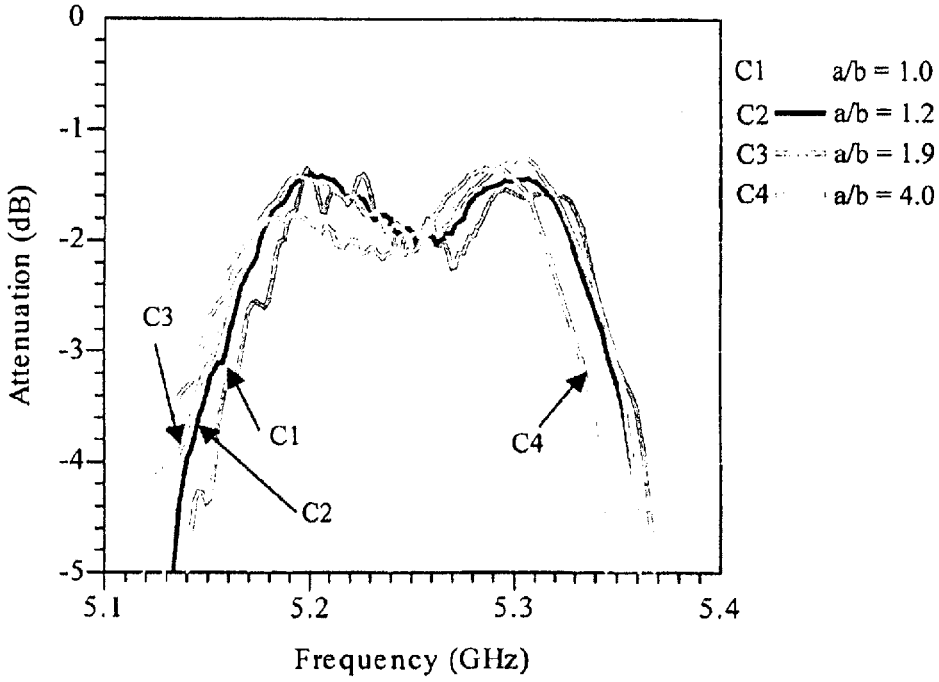
FIG. 5 shows a graph illustrating band characteristics of the filter with four axis ratios of an elliptical shape.

FIG. 5 shows band characteristics of the filters, which are described with parameter S21. The horizontal axis of the graph denotes frequency (GHz) and the vertical axis denotes attenuation (dB). Curves C1, C2, C3 and C4 are the band characteristics observed when the ratio a/b is equal to 1.0, 1.2, 1.9 and 4.0, respectively. A general filter specification for wireless devices requires the ripple in the passband to be suppressed to 0.3 dB or less. All the filters except a/b=1.0 meet the requirement, and it can be said that the ripple does not have a high dependency on the ratio a/b. In the case where a/b=4.0, the cavities are not formed properly in the parallel-arm resonators, and the loss in the low-frequency side of the passband is degraded. Therefore, by employing the elliptical shape that satisfies $1<a/b<1.9$, the ripple caused by the lateral mode can be suppressed to a practically acceptable level to produce the piezoelectric thin-film resonator and the filter having excellent productivity of the cavity.

Second Embodiment

Figure 6:
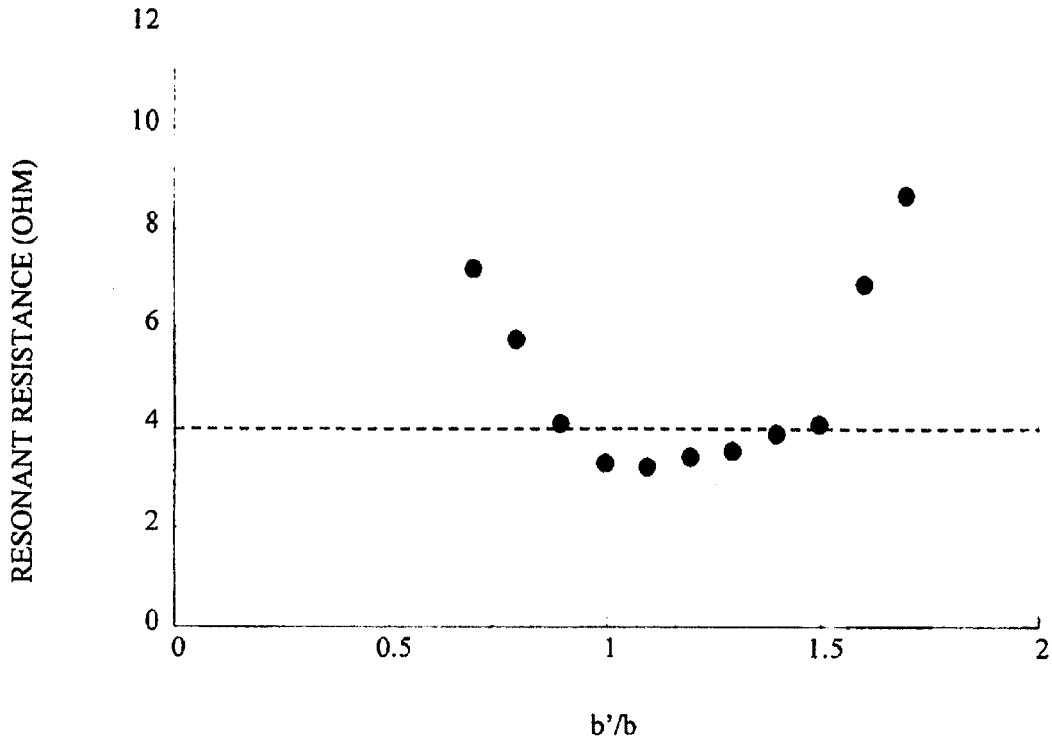
FIG. 6 shows b'/b dependency of a resonant resistance in accordance with a second embodiment of the present invention.

A description will now be given of a second embodiment of the present invention. The second embodiment has a specific relationship between the shape of elliptical shape and the size of the membrane 14 used in the first embodiment. The inventors evaluated any influence on characteristics, when altering the ratio of b'/b where b is the length of the sub axis of the elliptical shape in the membrane 14 where the upper electrode 13 overlaps with the lower electrode 11, and b' is the length of the sub axis of the cavity 15, as shown in FIGS. 1A and 1B. In the second embodiment, the size b is fixed and only the size b' is altered. The region where the upper electrode 13 overlaps with the lower electrode 11 through the dielectric film 12 has an elliptical shape such that a=60.2 μm and b=50.2 μm (a/b=1.2). The cap 15 has an elliptical shape that meets a/b=1.2. FIG. 6 shows a b'/b dependency of the resonant resistance. When b'/b is too small, the resonance characteristic is degraded because resonant vibration energy dissipates into the substrate 10. When b'/b is too large, the lower electrode 11 or the upper electrode 13 may be cracked, and the resonance characteristic is degraded. The general specification requires a tolerable range of the resonant resistance equal to four Ω or less. The requirement is met when the ratio b'/b falls in the range of $0.9<b'/b<1.5$.

Third Embodiment

Figures 7A, 7B, 7C:
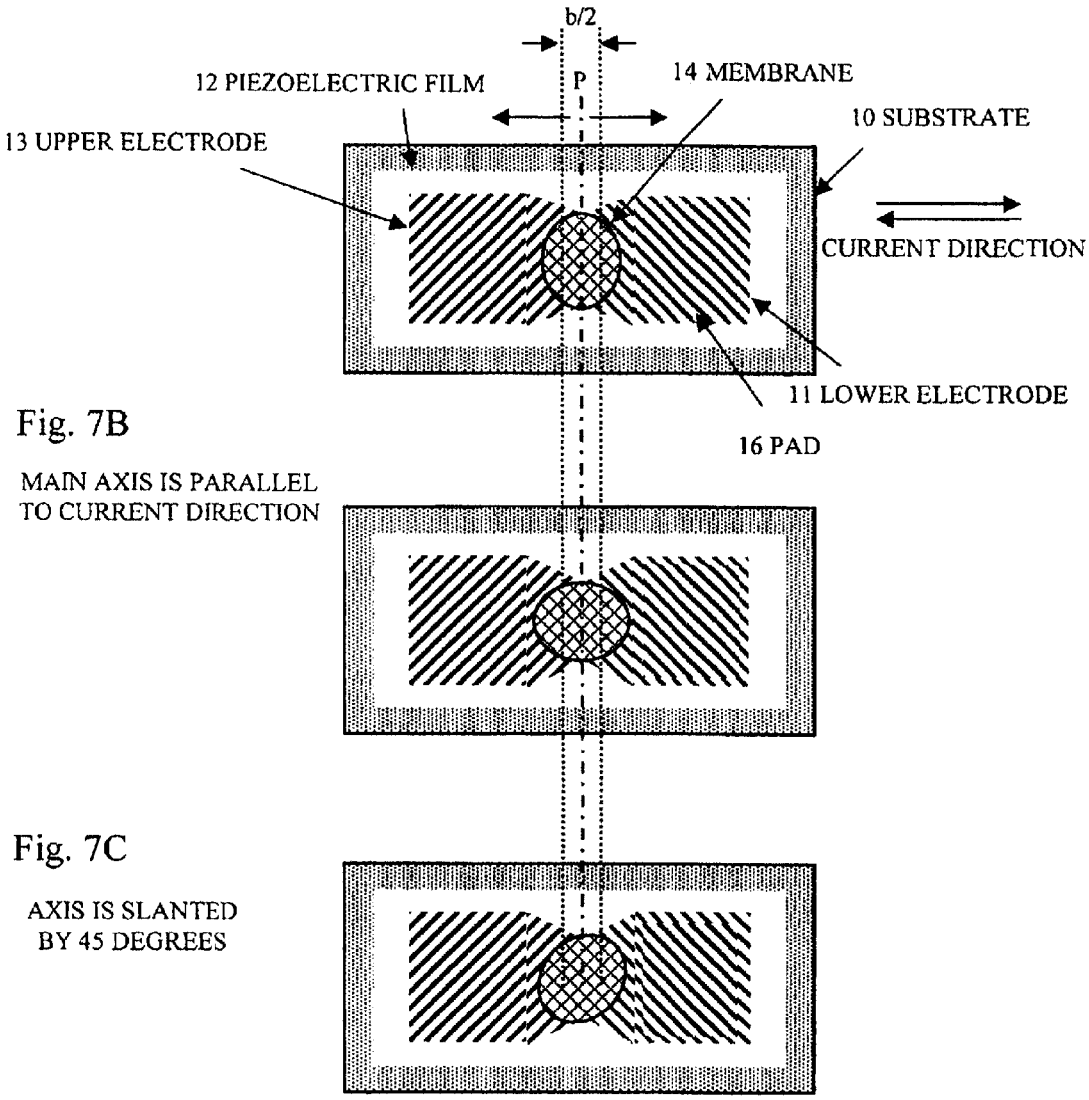
FIGS. 7A and 7B show plane views of a piezoelectric thin-film resonator in accordance with a third embodiment of the present invention.
FIG. 7C shows a comparative example of FIGS. 7A and 7B.

A description will now be given of a third embodiment of the present invention. The third embodiment has a specific relationship between the direction of the current flowing through a piezoelectric thin-film resonator and the axis direction of the elliptical shape in the membrane 14 where the upper electrode 13 overlaps with the lower electrode 11 through the dielectric film 12. The inventors studied the relationship for three piezoelectric thin-film resonators shown in FIGS. 7A, 7B, and 7C. FIG. 7A shows a case where the sub axis is parallel to the current direction (hereinafter referred to type A). FIG. 7B shows a case where the main axis is parallel to the current direction (hereinafter referred to type B). FIG. 7C shows a case where the main and sub axes are slanted by 45 degrees to the current direction (hereinafter referred to type C). The types A and B have substantially symmetric shapes in which the upper electrode 13 and the lower electrode 11 are symmetric about an axis P that is perpendicular to the current direction, within at least a range equal to half the sub axis, namely b/2. In contrast, the type C does not have symmetry within the range. The elliptical shape of the overlapping region has a size such that a=86.1 μm and b=61.5 μm (a/b=1.4). Table 2 shows the lowest insertion losses in the above-mentioned three piezoelectric thin-film resonators and irregularity thereof.

TABLE 2

| Type | Lowest insertion loss | Irregularity (3σ) |
|---|---|---|
| A | 0.18 dB | 3.2% |
| B | 0.22 dB | 3.7% |
| C | 0.35 dB | 7.6% |

Type C is larger in both lowest insertion loss and irregularity than those of the types A and B. In terms of warping of the membrane, the types A and B are finely curved in the shape of a dome, while the type C is irregularly distorted like a potato chip. The types A and B are highly symmetric, and get finely curved when compression stress is applied in parallel with the current direction through the membrane. However, the type C is not finely symmetric with respect to the current direction in which stress is applied, and is irregularly curved. This results in affects on the above-mentioned characteristics.

Thus, as shown in FIGS. 7A and 7B, it is preferable that the main or sub axis of the elliptical shape is substantially parallel to the current direction. In addition, it is preferable that the upper electrode 13 and the lower electrode 11 have portions that overlap each other through the dielectric film 12 to form the elliptically shaped region and are symmetric about the axis P perpendicular to the current direction of the elliptical shape within the range equal to at least half the length of the sub axis b.

Referring back to FIG. 3A, on the ladder-type filter, all the piezoelectric thin-film resonators S1 through S4 and P1 through P3 are so disposed that the sub axis of the elliptical shape defined by the overlapping portions of the upper electrode 13 and the lower electrode 11 is substantially parallel to the current direction. It is also possible to arrange the piezoelectric thin-film resonators S1 through S4 and P1 through P3 of the ladder-type filter shown in FIG. 3A so that the main axis of the elliptical shape in each resonator is substantially parallel to the current direction, as shown in FIG. 7B. It is still possible to modify the ladder-type filter shown in FIG. 3A so that it has both the type A in FIG. 7A and the type B in FIG. 7B.

Fourth Embodiment

Figure 8A:
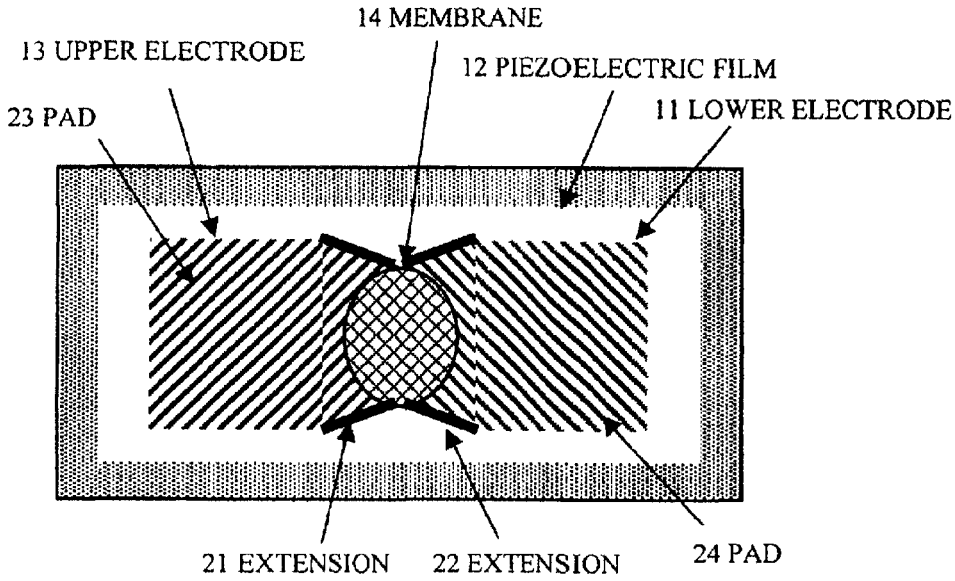
FIG. 8A shows a plane view of a piezoelectric thin-film resonator in accordance with a fourth embodiment of the present invention.
Figure 8B:
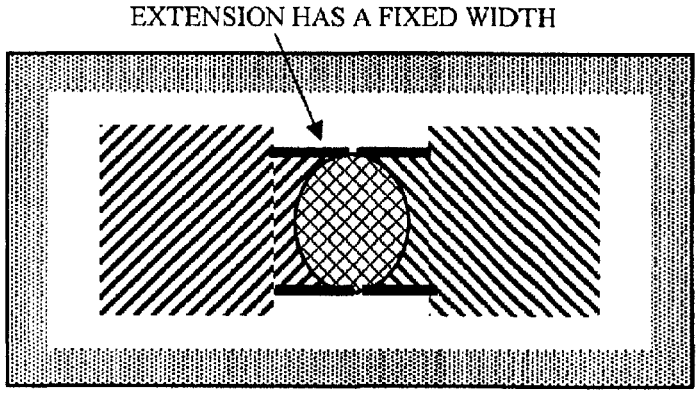
FIG. 8B shows a comparative example of FIG. 8A.

A fourth embodiment of the present invention is focused on the structure of the extensions of the upper electrode 13 and the lower electrode 11 in which the extensions extend outwardly from the elliptical shape in which the upper electrode 13 overlaps with the lower electrode 11 through the dielectric film 12. FIG. 8A shows a plane view of a piezoelectric thin-film resonator in accordance with the fourth embodiment. A reference numeral 21 denotes an edge of the extension of the upper electrode 13. A reference numeral 22 is an extension of the lower electrode 11. In FIG. 8A, the edges are drawn in thick solid lines in order to emphasize the edges. The extension 21 of the upper electrode 13 has a shape that the width becomes larger outwards from the center of the elliptical shape. The length of the main axis of the elliptical shape is a; therefore, the width of the extension 21 is larger than a. The extension 21 is formed integrally with a pad 23. The lower electrode 11 is exposed through an opening provided in the piezoelectric film 12. The exposed portion is used as the pad 24. The extension 22 of the lower electrode 11, similarly to that of the upper electrode 13, has a shape that the width becomes larger outwards from the center of the elliptical shape. Here, the length of the main axis of the elliptical shape is a; therefore, the width of the extension 22 is larger than a. The extensions 21 and 22 are thus tapered and are substantially symmetric. The edges 21 and 22 may have a shape of either line or curve. FIG. 8B is a comparative example. A piezoelectric thin-film resonator of the comparative example has extensions with a constant width.

The inventors produced the piezoelectric thin-film resonators as shown in FIGS. 8A and 8B under the following conditions and examined the strength of a membrane 14. As shown in FIGS. 8A and 8B, the elliptical shape formed by the overlapping portions of the upper electrode 13 and the lower electrode 11 had a size such that a=86.1 μm and b=61.5 μm (a/b=1.4). The lower electrode 11 had a double layer structure of Ru (100 nm) and Cr (50 nm). The piezoelectric film 12 was made of AlN (400 nm), and the upper electrode 13 was made of Ru (100 nm). The piezoelectric thin-film resonators shown in FIGS. 8A and 8B were produced under the condition that a laminate composed of the above-mentioned electrodes and film and followed by patterning has internal stress equal to −1.56 Ga. The inventors found out a great difference in membrane damage between the two piezoelectric thin-film resonators after cavities were formed. More specifically, 27 percent of the membrane shown in FIG. 8B was damaged, while nothing was substantially damaged in the membrane shown in FIG. 8A. Thus, even if the films having the same internal stress are used, the membrane has different strengths that depend on the shape of the extensions. As a result of the above consideration, it can be said that the membrane of FIG. 8A has a less damaged structure than that of FIG. 8B.

The sub axis of the elliptical shape is substantially parallel to the current direction shown in FIG. 8A. However, even if the main axis of the elliptical shape is substantially parallel to the current direction, the same function and effect as mentioned above are obtainable by arranging the extensions of the upper and lower electrodes so as to have an increasing width outwards from the center of the elliptical shape. Preferably, the extension 21 of the upper electrode 13 and the extension 22 of the lower electrode 11 are formed as shown in FIG. 8A. However, only one of the extensions 21 and 22 may be arranged so that the width becomes larger outwards from the center of the elliptical shape.

Fifth Embodiment

Figure 9:
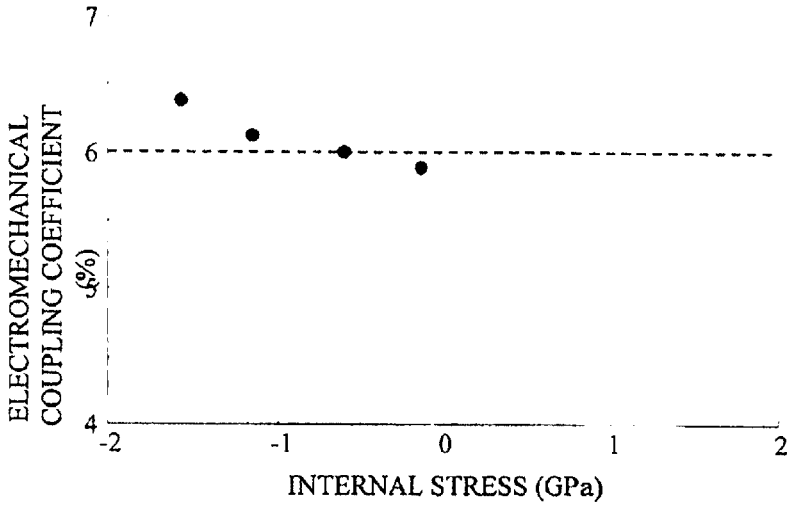
FIG. 9 shows a relationship between internal stress and electromechanical coupling coefficient.

A fifth embodiment of the present invention has a structure defined by taking internal stress and resonance characteristic of a film laminate into consideration. The film laminate is composed of the lower electrode 11, the piezoelectric film 12, and the upper electrode 13. The inventors conducted an experiment directed to investigating the affect of the internal stress on the resonance characteristic. The piezoelectric thin-film resonator used in the experiment had the following laminate structure. The lower electrode 13 had a double layer structure of Ru (100 nm)/Cr (50 nm). The piezoelectric film 12 was AlN and 400 nm thick. The upper electrode 13 was made of Ru and 100 nm thick. The elliptical shape of the region defined by overlapping the upper electrode 13 overlaps with the lower electrode 11 had a size such that a=60.2 μm and b=50.2 μm (a/b=1.2). The cavity 15 was a size such that a=66.2 μm and b=55.2 μm (a/b=1.2). FIG. 9 shows a relationship between internal stress (GPa) and electromechanical coupling coefficient ($K^2$). It is noted that the internal stress denotes the stress of the above-mentioned film laminate before patterning. It can be seen from FIG. 9 that the larger the compression stress, the greater the electromechanical coupling coefficient ($K^2$). In the above-mentioned experiment, two films having two kinds of tensile stress of 0.52 GPa and 0.87 Gpa were produced. However, both the membranes were broken after the cavities 15 were defined. A general specification requires an electromechanical coupling coefficient ($K^2$) equal to six percent or higher. Therefore, the film of −0.68 GPa or less in compression stress is required to satisfy the specification.

Figure 10:
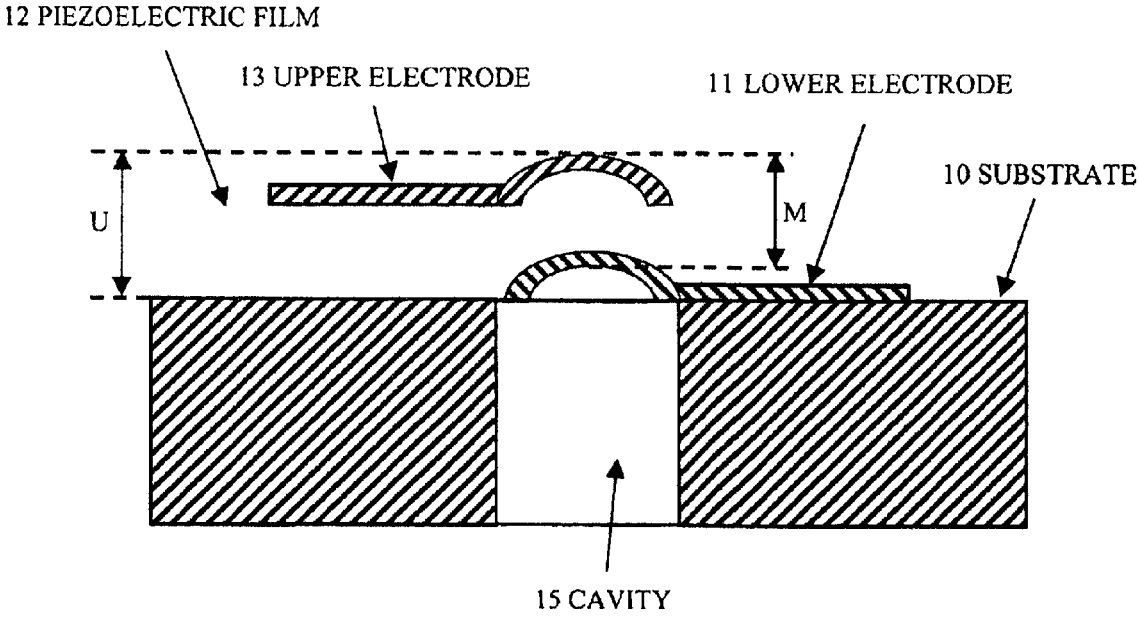
FIG. 10 shows a cross-section view of a membrane of a piezoelectric thin-film resonator after a cavity is formed.
Figure 11:
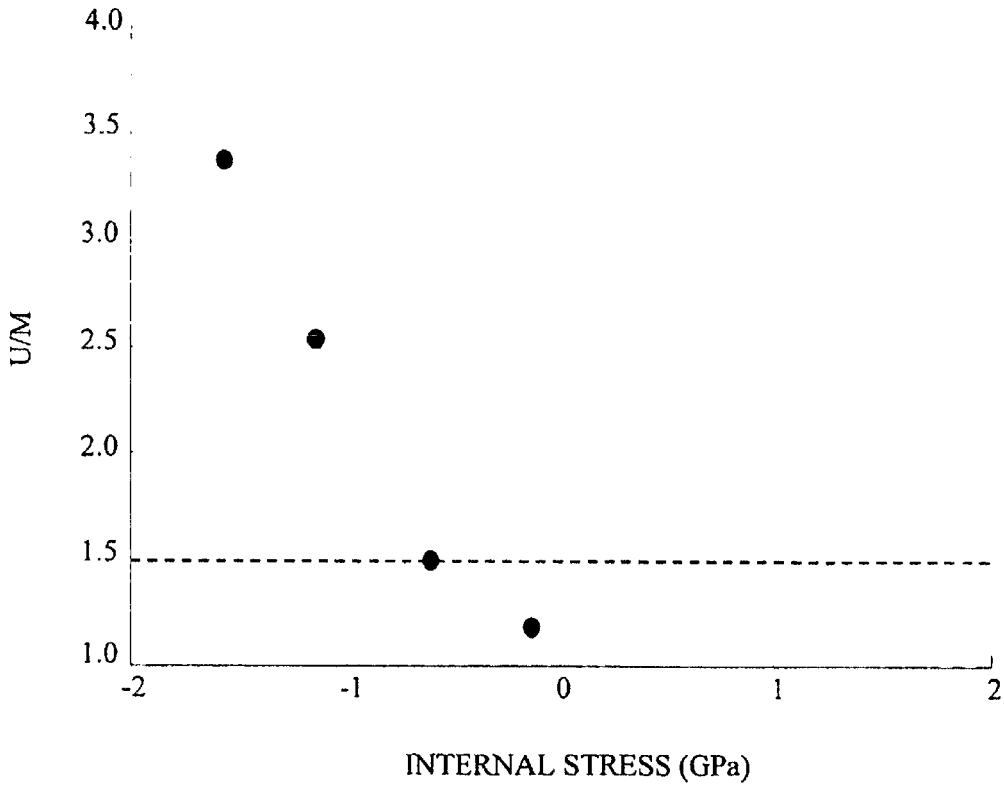
FIG. 11 shows a graph illustrating a relationship between parameters U and M shown in FIG. 10.
Figure 3A:
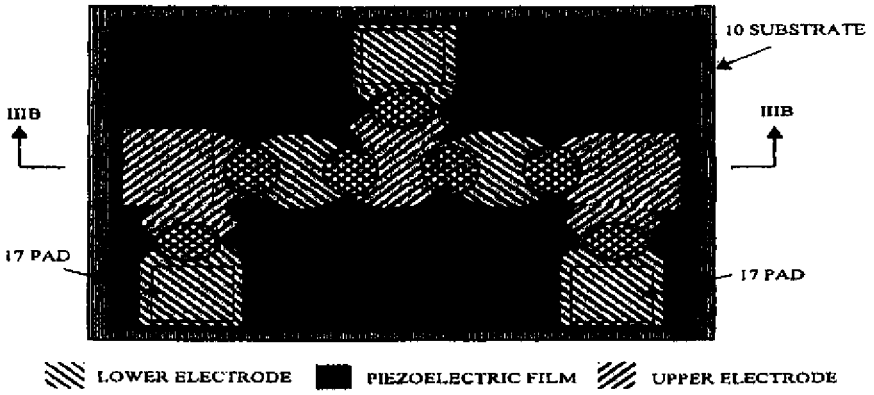
Figure 3B:
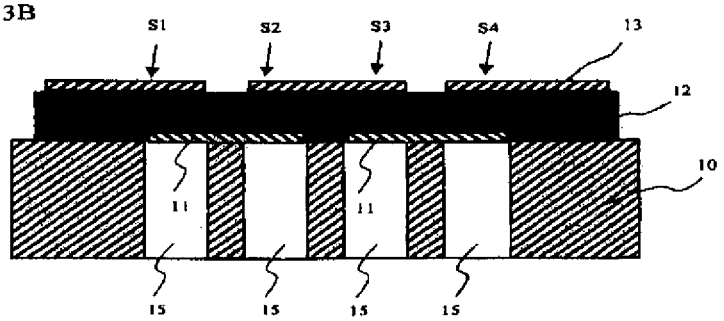
Figure 7A:
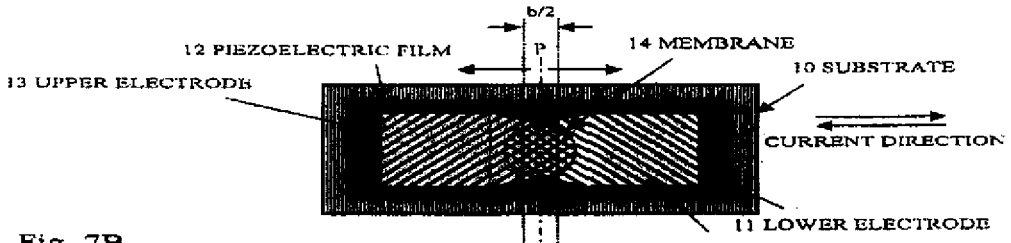
Figure 7B:
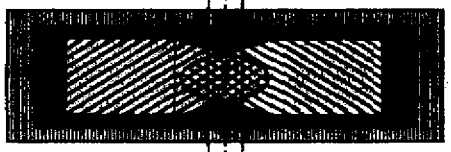
Figure 7C:
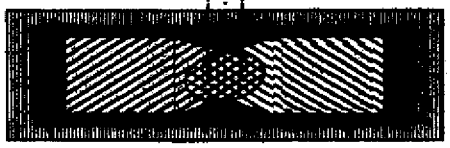
Figure 8A:
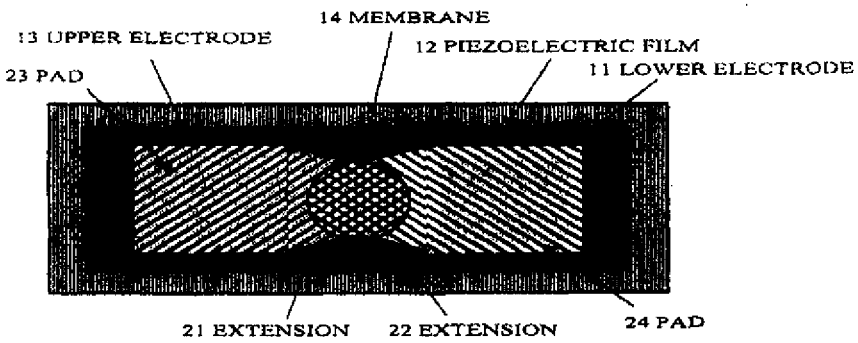
Figure 8B:
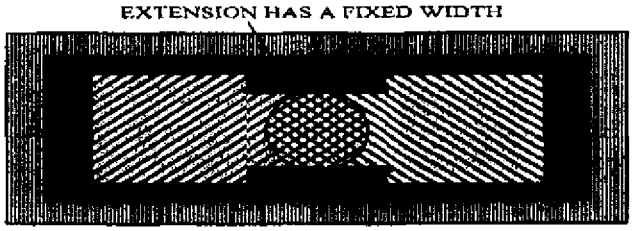
Figure 10:
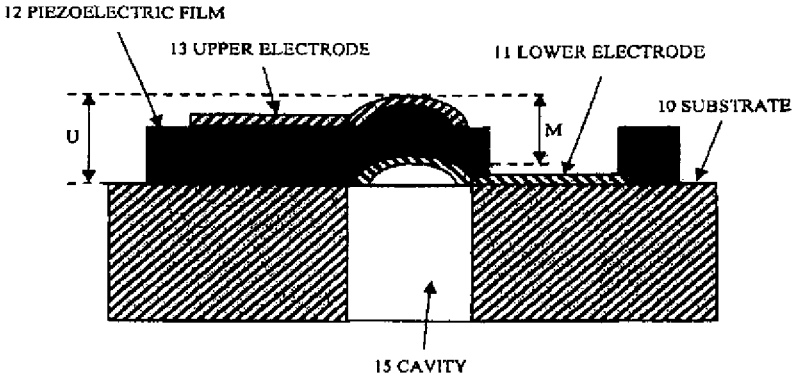

In the case where the film with stress is employed, the membrane is warped after the cavity is provided. Especially, in the case where the film with compression stress is employed, the membrane 14 is curved outwards in the opposite side to the cavity 15 after the cavity 15 is provided, as shown in FIG. 10. FIG. 11 shows a relationship between U/M and the internal stress, where M is the thickness of the membrane 14 (650 nm in the fifth embodiment), and U is the maximum height measured from the surface of the substrate 11 above the membrane 14. It can be seen from FIG. 11 that the larger the compression stress, the greater the curve of the membrane 14. According to the above-mentioned result, it is possible to produce a desired piezoelectric thin-film resonator with an electromechanical coupling coefficient ($K^2$) of six percent or more when U/M is equal to 1.5 or higher.

Sixth Embodiment

A sixth embodiment of the present invention is a piezoelectric thin-film resonator and a filter device that employs an acoustic reflector substituted for the cavity 15 located below the membrane 14. The acoustic reflector is composed of high and low acoustic impedance films that are alternately laminated by the thickness of λ/4, where λ is a wavelength of an elastic wave.

In accordance with the present invention, even with the structure intended to suppress adverse affects caused by the lateral mode waves, the piezoelectric thin-film resonator is configured so as to obtain a sufficient strength and excellent productivity of the cavity. Thus, the piezoelectric thin-film resonator with less irregularity in characteristics and the filter thereof are obtainable. In addition, by utilizing the film having the desired compression stress, the piezoelectric thin-film resonator with a large electromechanical coupling coefficient ($K^2$) and the filter thereof are obtainable.

The present invention is not limited to the above-mentioned first embodiment, and other embodiments and modifications may be made without departing from the scope of the present invention.

The present invention is based on Japanese Patent Application No. 2003-360054 filed on Oct. 20, 2003, the entire disclosure of which is hereby incorporated by reference.

What is claimed is:

1. A piezoelectric thin-film resonator comprising:

a substrate;

a lower electrode arranged on the substrate;

a piezoelectric film arranged on the lower electrode; and an upper electrode arranged on the piezoelectric film, a cavity being provided in the substrate and being located below the lower electrode in a region in which the upper electrode overlaps with the lower electrode through the piezoelectric film, the region and a cross-section of the cavity having an elliptical shape, $1<a/b<1.9$ is satisfied, where a is a main axis of the elliptical shape, and b is a sub axis thereof.

2. The piezoelectric thin-film resonator as claimed in claim 1, wherein the cavity and the lower electrode has a relationship of size that satisfies $0.9<b'/b<1.5$ where b' is a sub axis of the cavity.

3. The piezoelectric thin-film resonator as claimed in claim 1, wherein one of the main axis and the sub axis is substantially parallel to a current direction.

4. The piezoelectric thin-film resonator as claimed in claim 1, wherein the upper electrode and the lower electrode are substantially symmetric about an axis of the elliptical shape perpendicular to a current direction within a range equal to half the length of the sub axis in the current direction.

5. A piezoelectric thin-film resonator comprising:

a substrate;

a lower electrode arranged on the substrate;

a piezoelectric film arranged on the lower electrode; and an upper electrode arranged on the piezoelectric film, a cavity provided in the substrate and located below the lower electrode in a region in which the upper electrode overlaps with the lower electrode through the piezoelectric film, a membrane that includes the upper electrode and the lower electrode being formed above the cavity and being curved outwards, the membrane having a maximum height that is measured from a surface of the substrate and is at least 1.5 times the thickness of the membrane.

6. A filter comprising a plurality of piezoelectric thin-film resonators, at least one of the thin-film resonators comprising:

a substrate;

a lower electrode arranged on the substrate;

a piezoelectric film arranged on the lower electrode; and an upper electrode arranged on the piezoelectric film, a cavity being provided in the substrate and being located below the lower electrode in a region in which the upper electrode overlaps with the lower electrode through the piezoelectric film, the region and a cross-section of the cavity having an elliptical shape, $1<a/b<1.9$ being satisfied where a is a main axis of the elliptical shape and b is a sub axis thereof.

7. A filter comprising a plurality of piezoelectric thin-film resonators, at least one of the thin-film resonators comprising:

a substrate;

a lower electrode arranged on the substrate;

a piezoelectric film arranged on the lower electrode; and an upper electrode arranged on the piezoelectric film, a cavity provided in the substrate and located below the lower electrode in a region in which the upper electrode overlaps with the lower electrode through the piezoelectric film, a membrane that includes the upper electrode and the lower electrode being formed above the cavity and is curved outwards, the membrane having a maximum height that is measured from a surface of the substrate and is at least 1.5 times the thickness of the membrane.

*8. A piezoelectric thin-film resonator comprising: a substrate; a lower electrode arranged on the substrate; a piezoelectric film arranged on the lower electrode; and an upper electrode arranged on the piezoelectric film, a cavity being located below the lower electrode in a region in which the upper electrode overlaps with the lower electrode through the piezoelectric film, the region and a cross-section of the cavity having an elliptical shape, $1<a/b<1.9$ is satisfied, where a is a main axis of the elliptical shape, and b is a sub axis thereof.*

*9. The piezoelectric thin-film resonator as claimed in claim 8, wherein the cavity and the lower electrode has a relationship of size that satisfies $0.9<b'/b<1.5$ where b' is a sub axis of the cavity.*

*10. The piezoelectric thin-film resonator as claimed in claim 8, wherein one of the main axis and the sub axis is substantially parallel to a current direction.*

*11. The piezoelectric thin-film resonator as claimed in claim 8, wherein the upper electrode and the lower electrode are substantially symmetric about an axis of the elliptical shape perpendicular to a current direction within a range equal to half the length of the sub axis in the current direction.*

*12. A piezoelectric thin-film resonator comprising: a substrate; a lower electrode arranged on the substrate; a piezoelectric film arranged on the lower electrode; and an upper electrode arranged on the piezoelectric film, a cavity located below the lower electrode in a region in which the upper electrode overlaps with the lower electrode through the piezoelectric film, a membrane that includes the upper electrode and the lower electrode being formed above the cavity and being curved outwards, the membrane having a maximum height that is measured from a surface of the substrate and is at least 1.5 times the thickness of the membrane.*

*13. A filter comprising a plurality of piezoelectric thin-film resonators, at least one of the thin-film resonators comprising: a substrate; a lower electrode arranged on the substrate; a piezoelectric film arranged on the lower electrode; and an upper electrode arranged on the piezoelectric film, a cavity being located below the lower electrode in a region in which the upper electrode overlaps with the lower electrode through the piezoelectric film, the region and a cross-section of the cavity having an elliptical shape, $1<a/b<1.9$ being satisfied where a is a main axis of the elliptical shape and b is a sub axis thereof.*

*14. A filter comprising a plurality of piezoelectric thin-film resonators, at least one of the thin-film resonators comprising: a substrate; a lower electrode arranged on the substrate; a piezoelectric film arranged on the lower electrode; and an upper electrode arranged on the piezoelectric film, a cavity located below the lower electrode in a region in which the upper electrode overlaps with the lower electrode through the piezoelectric film, a membrane that includes the upper electrode and the lower electrode being formed above the cavity and is curved outwards, the membrane having a maximum height that is measured from a surface of the substrate and is at least 1.5 times the thickness of the membrane.*

* * * * *

UNITED STATES PATENT AND TRADEMARK OFFICE

CERTIFICATE OF CORRECTION

PATENT NO. : RE41,813 E
APPLICATION NO. : 12/276318
DATED : October 12, 2010
INVENTOR(S) : Tokihiro Nishihara et al.

It is certified that error appears in the above-identified patent and that said Letters Patent is hereby corrected as shown below:

The Title page showing an illustrative figure, should be deleted and substitute therefor the attached title page.

IN THE DRAWINGS:

Please delete Fig. 1A, Fig. 1B, Fig. 3A, Fig. 3B, Fig. 7A, Fig. 7B, Fig. 7C, Fig. 8A, Fig. 8B and 10 in their entirety and substitute therefor the following:

Fig. 1A

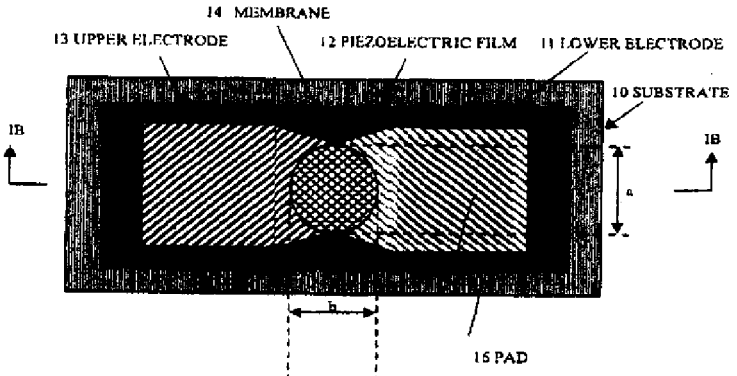

Fig. 1B

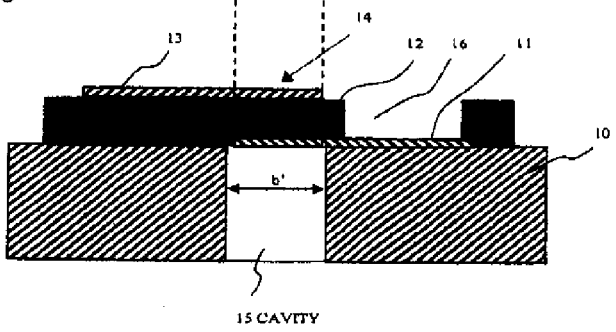

--

Signed and Sealed this
Thirtieth Day of October, 2012

David J. Kappos

David J. Kappos
*Director of the United States Patent and Trademark Office*

SUB AXIS IS PARALLEL TO CURRENT DIRECTION

MAIN AXIS IS PARALLEL TO CURRENT DIRECTION

AXIS IS SLANTED BY 45 DEGREES

--.

(19) United States
(12) Reissued Patent
Nishihara et al.

(10) Patent Number: US RE41,813 E
(45) Date of Reissued Patent: Oct. 12, 2010

(54) PIEZOELECTRIC THIN-FILM RESONATOR AND FILTER USING THE SAME

(75) Inventors: Tokihiro Nishihara, Kanagawa (JP); Tsuyoshi Yokoyama, Kanagawa (JP); Takeshi Sakashita, Kanagawa (JP); Masafumi Iwaki, Kanagawa (JP); Tsutomu Miyashita, Kanagawa (JP)

(73) Assignees: Taiyo Yuden Co., Ltd., Tokyo (JP); Fujitsu Media Devices Limited, Yokohama (JP)

(21) Appl. No.: 12/276,318

(22) Filed: Nov. 22, 2008

Related U.S. Patent Documents

Reissue of:
(64) Patent No.: 7,211,931
Issued: May 1, 2007
Appl. No.: 10/966,035
Filed: Oct. 18, 2004

(51) Int. Cl.
*H01L 41/08* (2006.01)

(52) U.S. Cl. ..... 310/324; 310/366
(58) Field of Classification Search ..... 310/320, 310/366, 365, 324, 311, 363; 333/187, 189; *H01L 41/047, 41/08*
See application file for complete search history.

(56) References Cited

U.S. PATENT DOCUMENTS

| | | | | | |
|---|---|---|---|---|---|
| 4,642,508 | A | * | 2/1987 | Suzuki et al. | 310/324 |
| 5,281,935 | A | * | 1/1994 | Knecht et al. | 333/187 |
| 6,147,438 | A | * | 11/2000 | Nishiwaki et al. | 310/363 |
| 6,150,703 | A | | 11/2000 | Cushman et al. | |
| 6,215,375 | B1 | | 4/2001 | Larson et al. | 310/365 |
| 6,384,697 | B1 | | 5/2002 | Ruby | |
| 7,199,504 | B2 | * | 4/2007 | Komuro et al. | 310/366 |
| 7,498,717 | B2 | * | 3/2009 | Yokoyama et al. | 310/320 |
| 2003/0127945 | A1 | | 7/2003 | Nakamura et al. | |

FOREIGN PATENT DOCUMENTS

| | | | |
|---|---|---|---|
| JP | 6-295181 | A | 10/1994 |
| JP | 8-148968 | A | 6/1996 |
| JP | 2003-133892 | | 5/2003 |
| JP | 2003-204239 | | 7/2003 |
| JP | 2003-289235 | A | 10/2003 |
| JP | 2004-200843 | A | 7/2004 |
| JP | 2005-33379 | A | 2/2005 |
| JP | 2005-109678 | A | 4/2005 |
| JP | 2005-236518 | A | 9/2005 |
| JP | 2006-157259 | A | 6/2006 |
| WO | WO 03/041273 | A1 | 5/2003 |

* cited by examiner

*Primary Examiner*—Walter Benson
*Assistant Examiner*—Karen B Addison
(74) *Attorney, Agent, or Firm*—Arent Fox LLP

(57) ABSTRACT

A piezoelectric thin-film resonator includes a substrate, a lower electrode arranged on the substrate, a piezoelectric film arranged on the lower electrode, and an upper electrode arranged on the piezoelectric film. A region in which the upper electrode overlaps with the lower electrode through the piezoelectric film has an elliptical shape, and a condition such that $1<a/b<1.9$ is satisfied where a is a main axis of the elliptical shape, and b is a sub axis thereof.

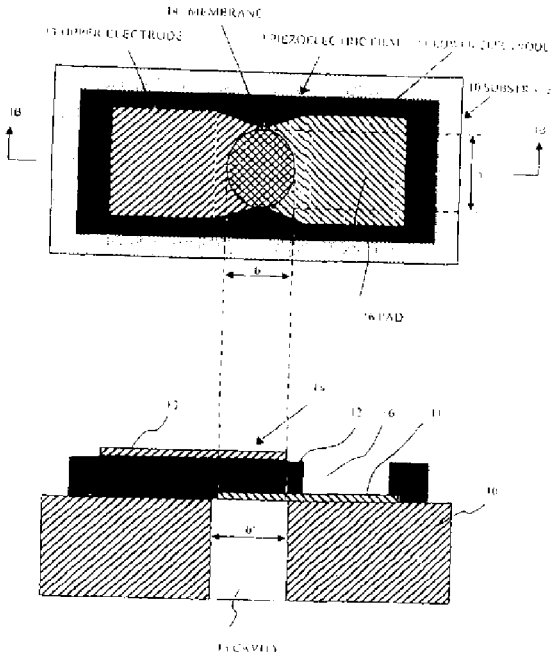

14 Claims, 9 Drawing Sheets